(12) United States Patent
Takahashi (10) Patent No.: US 8,643,145 B2
(45) Date of Patent: Feb. 4, 2014

(54) SEMICONDUCTOR DEVICE

(75) Inventor: Yukio Takahashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 153 days.

(21) Appl. No.: 13/414,651

(22) Filed: Mar. 7, 2012

(65) Prior Publication Data

US 2012/0228740 A1 Sep. 13, 2012

(30) Foreign Application Priority Data

Mar. 9, 2011 (JP) ................................ 2011-052029

(51) Int. Cl.
*H01L 29/00* (2006.01)
*H01L 21/02* (2006.01)

(52) U.S. Cl.
USPC ............ 257/538; 257/528; 257/536; 257/537

(58) Field of Classification Search
USPC .................................. 257/528, 536, 537, 538
See application file for complete search history.

(56) References Cited

U.S. PATENT DOCUMENTS

| | | | |
|---|---|---|---|
| 6,611,042 B2 * | 8/2003 | Haruhana et al. ............. | 257/536 |
| 7,045,865 B2 * | 5/2006 | Amishiro et al. ............. | 257/379 |
| 2006/0175679 A1 | 8/2006 | Amishiro et al. | |
| 2008/0116526 A1 | 5/2008 | Amishiro et al. | |
| 2010/0232210 A1 | 9/2010 | Kajiyama et al. | |
| 2011/0012231 A1 | 1/2011 | Amishiro et al. | |

FOREIGN PATENT DOCUMENTS

| | | |
|---|---|---|
| JP | 2002-261244 A | 9/2002 |
| JP | 2010-219098 A | 9/2010 |

* cited by examiner

*Primary Examiner* — Chuong A Luu
*Assistant Examiner* — Cory Eskridge
(74) *Attorney, Agent, or Firm* — McGinn IP Law Group, PLLC (57) ABSTRACT

A semiconductor device including a substrate, an insulation film being embedded into the substrate and having multiple openings, multiple dummy diffusion layers formed in the substrate and located in the openings, multiple resistance elements being formed over the insulation film so as not to overlap the dummy diffusion layers in a plan view in a resistance element forming region and extending in a first direction, and multiple dummy resistance elements being formed over the insulation film and the dummy diffusion layers and extending in the first direction in the resistance element forming region, in which each of the dummy resistance elements overlaps at least two dummy diffusion layers aligning in a second direction perpendicular to the first direction in a plane horizontal to the substrate in a plan view.

10 Claims, 11 Drawing Sheets

SEMICONDUCTOR DEVICE

CROSS-REFERENCE TO RELATED APPLICATIONS

The disclosure of Japanese Patent Application No. 2011-52029 filed on Mar. 9, 2011 including the specification, drawings and abstract is incorporated herein by reference in its entirety.

BACKGROUND

The present invention relates to a semiconductor device having a resistance element.

Multiple resistance elements may be formed in a semiconductor device in some cases. The technology described in Patent Literature 1 for example is a technology that relates to a semiconductor memory device having multiple variable resistance elements. More specifically, that is a technology of forming a dummy element in a memory region where plural variable resistance elements are formed. It describes that thereby the characteristic variation of the variable resistance elements can be reduced.

Then the technology described in Patent Literature 2 for example is a technology that relates to a semiconductor device having a polyresistance formed over an element isolation film over a semiconductor substrate. More specifically, it describes that the dishing phenomenon occurring in an element isolation film can be inhibited by forming an active region at a position close to a resistance element. The dishing phenomenon is a phenomenon of forming a recess in the center of an element isolation film when the element isolation film is flattened by a CMP (Chemical Mechanical Polishing) method.

[Patent Literature 1]
Japanese Unexamined Patent Application Publication No. 2010-219098
[Patent Literature 2]
Japanese Unexamined Patent Application Publication No. 2002-261244

SUMMARY

A resistance element formed in a semiconductor device may sometimes be formed over an element isolation film formed over a semiconductor substrate in order to insulate and separate the resistance element from the semiconductor substrate. An element isolation film is formed for example by embedding an insulation film into a grove formed by etching a semiconductor substrate by a CVD (Chemical Vapor Deposition) method or the like and polishing it by a CMP method.

It sometimes happens however that a recess may form in the center of an element isolation film by a dishing phenomenon. If a dishing phenomenon appears, the processing shape of a resistance element formed over an element isolation film varies and hence the resistance accuracy of the whole resistance network deteriorates considerably.

Further, it sometimes happens that a semiconductor substrate is etched insufficiently and an unetched part may remain in a groove of the semiconductor substrate in the process of etching the semiconductor substrate in order to form the groove into which an element isolation film is embedded. If an unetched part remains, it sometimes happens that a semiconductor substrate is exposed through an element isolation film embedded into a groove and short circuit may be generated between a resistance element formed over the element isolation film and the semiconductor substrate. In this way, the reliability of a semiconductor device has been hardly secured.

According to one aspect of the present invention, there is provided a semiconductor device including a substrate, an insulation film being embedded into the substrate and having multiple openings, multiple dummy diffusion layers formed in the substrate and located in the openings, multiple resistance elements being formed over the insulation film so as not to overlap the dummy diffusion layers in a planar view in a resistance element forming region and extending in a first direction, and multiple dummy resistance elements being formed over the insulation film and the dummy diffusion layers and extending in the first direction in the resistance element forming region, wherein each of the dummy resistance elements overlaps at least two dummy diffusion layers aligning in a second direction perpendicular to the first direction in a plane horizontal to the substrate in a planar view.

According to the aspect of the present invention, multiple dummy diffusion layers are formed in a substrate. Then each of the dummy resistance elements formed in a resistance element forming region overlaps at least two dummy diffusion layers aligning in a second direction perpendicular to a first direction in a plane horizontal to the substrate in a planar view. By so doing, the region where an insulation film is formed reduces. As a result, it is possible to inhibit production conditions in insulation film forming from varying. Consequently, it is possible to inhibit a dishing phenomenon from occurring.

Meanwhile, the present inventors have found that the occurrence of an unetched part remaining in a grove of a semiconductor substrate reduces when parts where the semiconductor substrate remains as dummy diffusion layers are arrayed uniformly in the event of etching the semiconductor substrate. According to the aspect of the present invention, at least two dummy diffusion layers aligning in a second direction exist in a region overlapping a dummy resistance element. As a result, the dummy diffusion layers can be arrayed uniformly in comparison with the case of forming one dummy diffusion layer under a dummy resistance element for example. Consequently, it is possible to reduce the occurrence of an unetched part remaining in a grove of a semiconductor substrate. Resultantly, it is possible to secure the reliability of a semiconductor device.

The present invention makes it possible to secure the reliability of a semiconductor device.

DETAILED DESCRIPTION

Preferred embodiments of the present invention are hereunder explained in reference to drawings. Here, in all the drawings, similar constituent components are represented by similar symbols and explanations are omitted occasionally.

Figure 1:
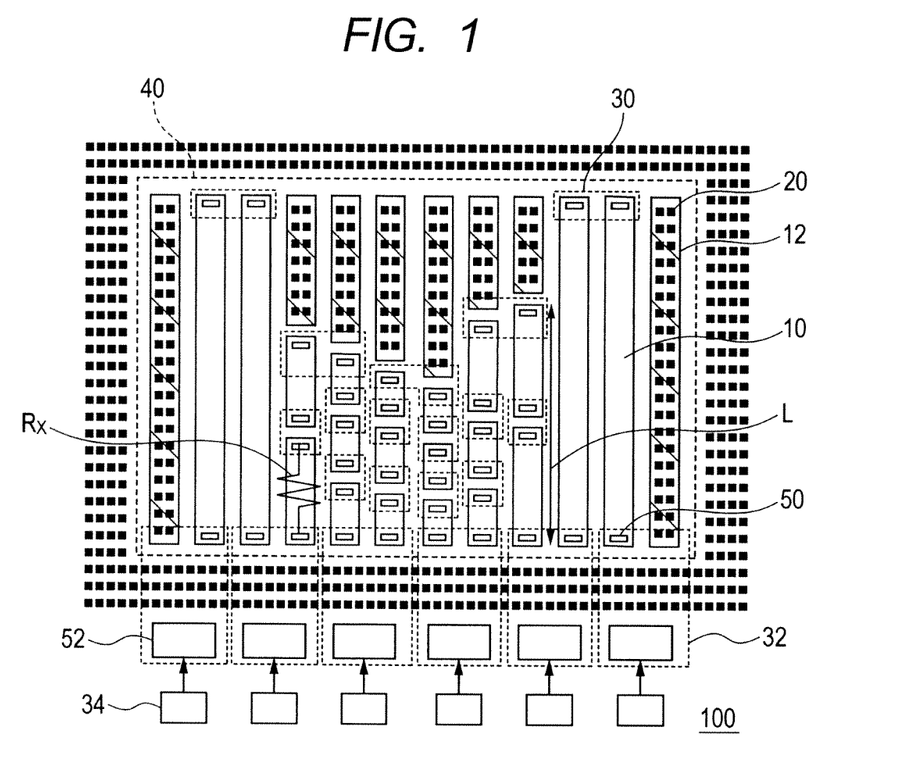
FIG. 1 is a plan view showing a semiconductor device according to a first embodiment.
Figure 2:
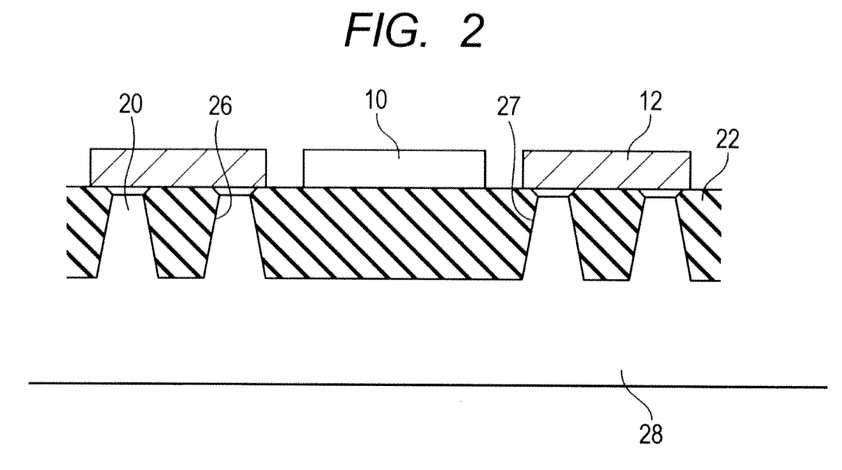
FIG. 2 is a sectional view showing the semiconductor device shown in FIG. 1.

FIG. 1 is a plan view showing a semiconductor device 100 according to the first embodiment and schematically shows the configuration of the semiconductor device 100. FIG. 2 is a sectional view showing the semiconductor device 100 shown in FIG. 1. The semiconductor device 100 according to the present embodiment comprises a substrate 28, an element isolation film 22, multiple dummy diffusion layers 20, multiple resistance elements 10, and multiple dummy resistance elements 12. The resistance elements 10 are gamma resistance groups constituting a DAC (Digital Analog Converter) circuit to convert a digital signal to an analog signal in a source driver IC.

The element isolation film 22 is embedded into the substrate 28. Then the element isolation film 22 has multiple openings 26. The dummy diffusion layers 20 are formed in the substrate 28 and located in the openings 26 in the element isolation film 22. The resistance elements 10 are formed over the element isolation film 22 so as not to overlap the dummy diffusion layers 20 in a planar view in a resistance element forming region 40. The dummy resistance elements 12 are formed over the element isolation film 22 and the dummy diffusion layers 20 in the resistance element forming region 40. The resistance elements 10 and the dummy resistance elements 12 extend in a first direction. Each of the dummy resistance elements 12 overlaps at least two dummy diffusion layers 20 aligning in a second direction perpendicular to the first direction in a plane horizontal to the substrate 28 in a planar view. Here, in FIG. 1, the first direction means the vertical direction in the figure and the second direction means the transverse direction in the figure. The same is applied to FIGS. 6, 7, 12, and 13 described later. The configuration of the semiconductor device 100 is hereunder explained in detail.

Figure 4:
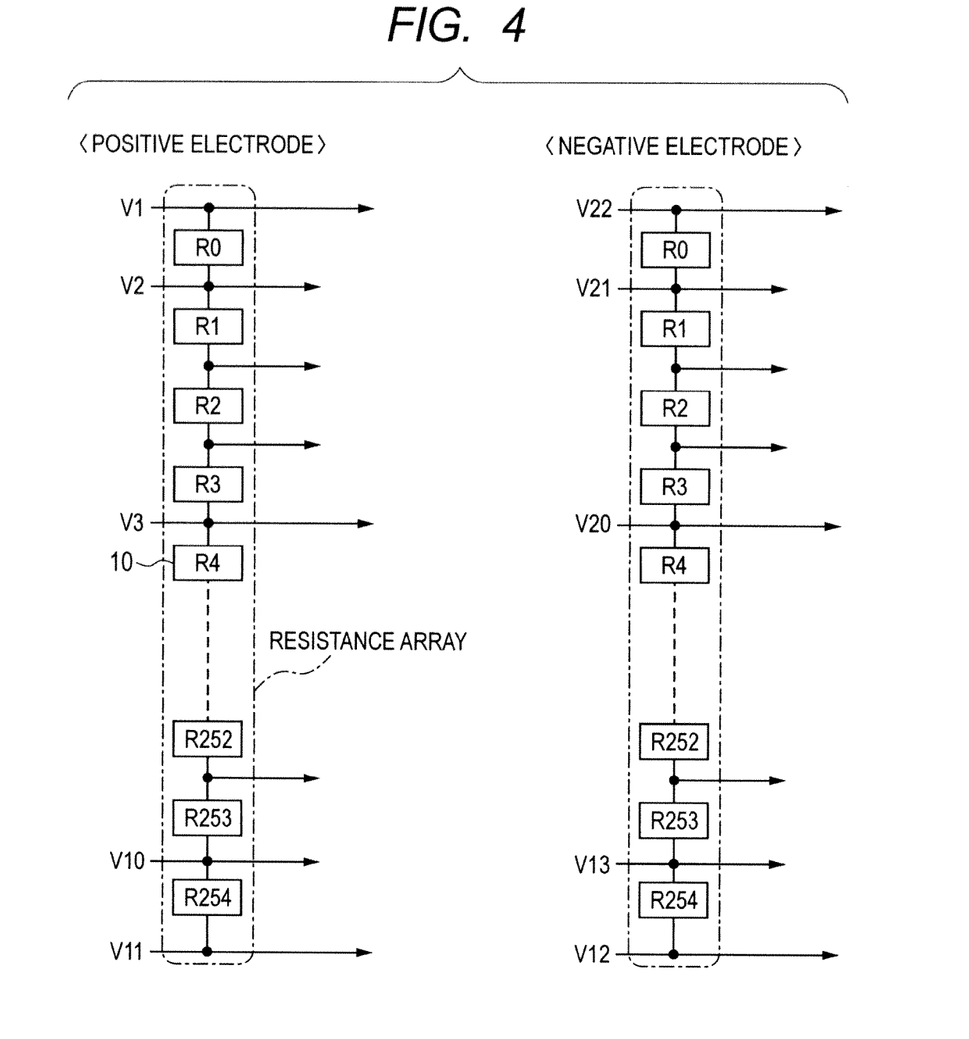
FIG. 4 is a view showing gamma resistances of a 256-tone source driver IC.

For example, 255 pieces of the resistance elements 10 are formed in the resistance element forming region 40 and constitute a gamma resistance array. On this occasion, a source driver IC of 256 tones (8 bits) can be obtained. FIG. 4 is a view showing gamma resistances of a 256-tone source driver IC. As shown in FIG. 4, the resistance elements 10 function as gamma resistances Rx and constitute a gamma resistance array. In a source device IC, it is necessary to apply a plus voltage and a minus voltage alternately (apply alternative voltage) to common voltage in order to inhibit a liquid crystal from degrading. Consequently, gamma resistance arrays are formed for a positive electrode and a negative electrode respectively.

As shown in FIG. 4, when the resistance elements 10 constitute a gamma resistance array of a 256-tone source driver IC, the size of the resistance element forming region 40 having the resistance elements 10 is about 200 μm×400 μm for example. Further, since the number of divided resistances increases, a high degree of resistance ratio accuracy is required. In the case of the source driver IC shown in FIG. 4 for example, a high degree of resistance ratio accuracy of about 15 mV or less is required for a liquid crystal drive voltage of 18 V.

Figure 5:
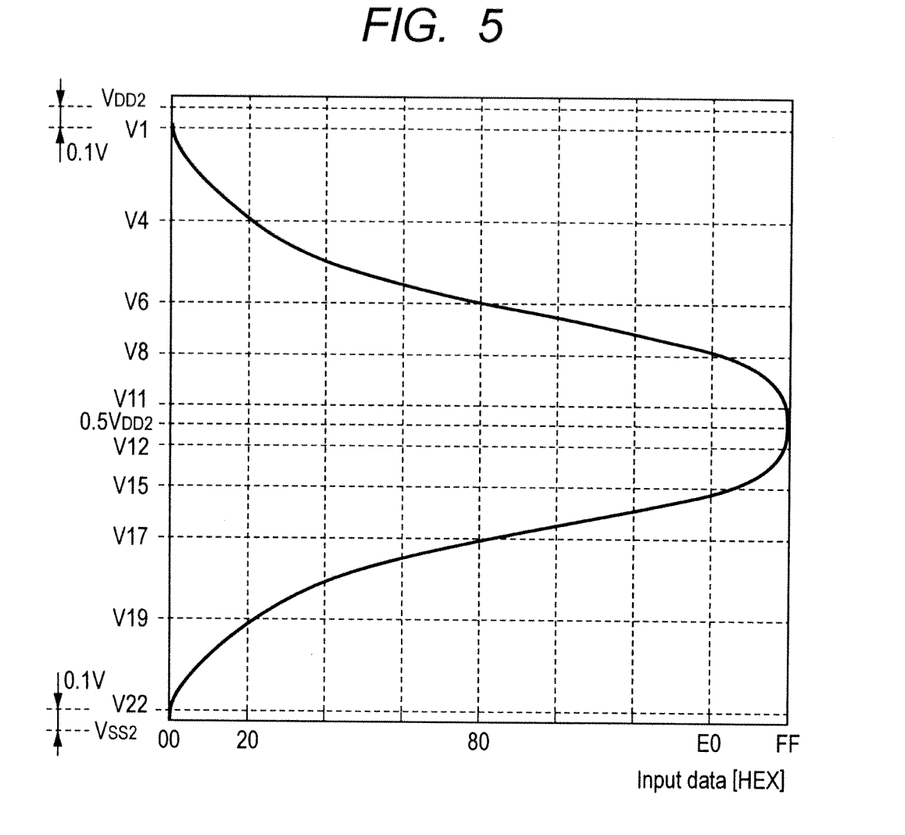
FIG. 5 is a graph showing the gamma characteristic of a 256-tone source driver IC.

FIG. 5 is a graph showing the gamma characteristic of a 256-tone source driver IC. As shown in FIG. 5, a liquid crystal display using a source driver IC has a characteristic of increasing display luminance (brightness) not proportionally but curvedly to the increase of a voltage inputted into the source driver IC. From such a characteristic of having a curved bell-shape, the resistance elements 10 as the gamma resistances Rx are designed so as to have various resistance values ranging from several Ω to several kΩ.

Further, as shown in FIG. 1, gamma input power sources 34 to input voltage from outside are disposed in order to fine-tune the gamma characteristic of the source driver IC having the resistance elements 10. The gamma input power sources 34 are represented by $V_X$ and disposed from V1 to V11 on the positive electrode side and from V12 to V22 on the negative electrode side as shown in FIG. 4 for example.

As shown in FIG. 1, the resistance elements 10 are formed so as to have an identical width in the second direction and have a width of 2 μm or more to 4 μm or less for example. Then the length in the first direction can be changed arbitrarily. By so doing, even when the resistance values of the resistance elements 10 are designed variously, the resistance values can be tuned by changing the lengths of the resistance elements 10. By forming such a configuration, it is possible to reduce the number of the resistance elements in comparison with the case of forming the resistance elements as a unit resistance having identical width and length. As a result, it is unnecessary to form a resistance expansion region to couple resistance elements to each other and wiring to couple resistance elements to each other and it is possible to reduce the area of the resistance element forming region. Further, it is also possible to inhibit the influence of the resistance component accompanying wiring to couple resistance elements to each other and improve resistance ratio accuracy.

Further, as shown in FIG. 1, the resistance elements 10 have contacts 50. The resistance elements 10 are coupled to each other and to internal circuits through the contacts 50 and wires 30. Then the resistance elements 10 are coupled to power source wires 32 and power source terminals 52 through the contacts 50. The gamma input power sources 34 apply voltage to the resistance elements 10 through the power source wires 32 and the power source terminals 52. The power source wires 32 and the power source terminals 52 are formed, respectively, and by applying appropriate voltages to the gamma input power sources 34 coupled to them, it is possible to fine-tune the gamma characteristic and materialize such an ideal gamma characteristic as shown in FIG. 5.

The power source wires 32 to couple the power source terminals 52 to the resistance elements 10 have to be designed so as to have resistances of several tens mΩ or less in order to avoid influence to a resistance division ratio. Consequently, the resistance elements 10 coupled to the gamma input power sources 34 are arrayed horizontally on the side of a side of the resistance element forming region 40 closest to the power source terminals 52. By so doing, it is possible to reduce the length of the power source wires 32 and prevent the resistance values of the power source wires 32 from increasing.

The dummy resistance elements 12 are indicated as the elements not having contacts 50 in resistance element groups formed in the resistance element forming region 40. That is, the dummy resistance elements 12 are not coupled to the other resistance elements 10 and others. The dummy resistance elements 12 formed in the resistance element forming region 40 have the functions of equalizing the production conditions of the resistance elements 10 and securing the resistance ratio accuracy of the resistance elements 10. As shown in FIG. 1, the length L of a resistance element group is different for each of the gamma input power sources 34. If the lengths of the resistance element groups are different between the gamma input power sources 34, it sometimes happens that the production conditions of the resistance elements 10 vary and the resistance ratio accuracy of the resistance elements 10 cannot be secured. Consequently, by forming the dummy resistance elements 12, the lengths of the resistance element groups are adjusted and the production conditions of the resistance elements 10 are inhibited from varying. Further, as shown in FIG. 1, dummy resistance elements 12 are formed outside the resistance element groups comprising the resistance elements 10 and the dummy resistance elements 12. The production conditions of each of the resistance elements 10 are different between the case of being adjacent to another resistance element 10 or a dummy resistance element 12 only on one side and the case of being adjacent to another resistance element 10 or a dummy resistance element 12 on both the sides. By forming dummy resistance elements 12 outside the resistance element groups, each of the resistance elements 10 is adjacent to another resistance element 10 or a dummy resistance element 12 on both the sides. In this way, the production conditions of the resistance elements 10 are inhibited from varying. As stated above, by forming the dummy resistance elements 12, it is possible to make the resistance ratio accuracy of the resistance elements 10 well.

Each of the dummy resistance elements 12 overlaps two dummy diffusion layers 20 aligning in the second direction in a planar view. Further, each of the dummy resistance elements 12 overlaps at least two dummy diffusion layers 20 aligning in the first direction in a planar view. By forming the dummy diffusion layers 20 plurally in a separating manner in a region overlapping each of the dummy resistance elements 12, it is possible to array the dummy diffusion layers 20 uniformly.

The dummy resistance elements 12 are formed so as to have a width identical to the resistance elements 10 in the second direction and have a width of 2 µm or more to 4 µm or less for example. The area occupied by the dummy resistance elements 12 accounts for 40% or more to 60% or less of the area occupied by the resistance element groups comprising the resistance elements 10 and the dummy resistance elements 12 for example. Further, the resistance elements 10 and the dummy resistance elements 12 comprise polysilicon for example. Here all of the distance between adjacent two resistance elements 10, the distance between adjacent two dummy resistance elements 12, and the distance between a resistance elements 10 and a dummy resistance elements 12 adjacent to each other can be equal to each other. By so doing, it is possible to make the resistance ratio accuracy of the resistance elements 10 well.

As shown in FIG. 1, the dummy diffusion layers 20 are located in regions overlapping the dummy resistance elements 12 and not located in other regions in the resistance element forming region 40 in a planar view. The configuration according to the present embodiment can easily be materialized for example by firstly deciding a resistance element layout and then designing so as to form the dummy diffusion layers 20 under the resistance elements where contacts are not formed. Consequently, the construction of the production programs and the like of a semiconductor device is facilitated. Further, the dummy diffusion layers 20 are arrayed so that the distance between two dummy diffusion layers 20 adjacent to each other in the second direction may be constant in a region overlapping the dummy resistance elements 12 in a planar view. Consequently, it is possible to array the dummy diffusion layers 20 uniformly.

Each of the dummy diffusion layers 20 has a square shape of 1.2 µm×1.2 µm for example over the surface of the substrate 28. Moreover, the area occupied by the dummy diffusion layers 20 formed in the resistance element forming region 40 accounts for 20% or more to 40% or less of the area of the resistance element forming region 40 over the surface of the substrate 28. The case where the area ratio of the dummy diffusion layers 20 to the resistance element forming region 40 is 20% or more is desirable from the viewpoint of inhibiting a dishing phenomenon from occurring.

Some of the dummy diffusion layers 20 are located outside the resistance element forming region 40. Then the dummy diffusion layers 20 located outside the resistance element forming region 40 are arrayed so that the distance between two dummy diffusion layers 20 adjacent to each other in the second direction may be constant. By so doing it is possible to array the dummy diffusion layers 20 uniformly while a dishing phenomenon is inhibited from occurring. Moreover, the dummy diffusion layers 20 located outside the resistance element forming region 40 are arrayed so that the distance between two dummy diffusion layers 20 adjacent to each other in the second direction may be equal to the distance between two dummy diffusion layers 20 adjacent to each other located in a region overlapping the dummy resistance elements 12 in a planar view. Consequently, it is possible to array the dummy diffusion layers 20 uniformly. In addition, the design of the dummy diffusion layers 20 is facilitated.

Figure 3:
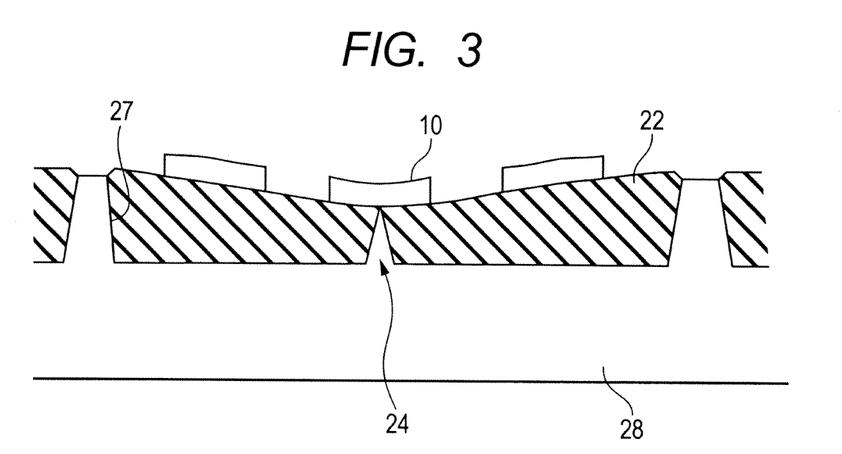
FIG. 3 is a sectional view showing a semiconductor device according to a comparative example.

The effects of the present embodiment are explained hereunder. FIG. 3 is a sectional view showing a semiconductor device according to a comparative example. An element isolation film 22 embedded into a substrate 28 is formed for example by embedding an insulation film into a groove 27 formed by etching the substrate 28 by a CVD method or the like and polishing it by a CMP method. On this occasion, if the region where the element isolation film 22 is formed is large, production conditions vary at parts of the element isolation film 22. For example, the polishing speed of an insulation film increases locally in the process of polishing by a CMP method. As a result, a dishing phenomenon of forming a recess in the center of a substrate 28 occurs as shown in FIG. 3. If a dishing phenomenon occurs, the processing shapes of resistance elements 10 formed over the element isolation film 22 vary and hence the resistance accuracy of the whole resistance network deteriorates considerably.

Further, it sometimes happens that, when a substrate 28 is etched, the substrate 28 is etched insufficiently and an unetched part 24 remains in a groove 27 of the substrate 28. If an unetched part 24 remains in a groove 27, a part of a substrate 28 is exposed through an element isolation film 22 embedded into the groove 27. As a result, short circuit is generated between a resistance element 10 formed over the element isolation film 22 and the semiconductor substrate 28. Moreover, the thickness of the element isolation film 22 reduces by the occurrence of the dishing phenomenon in the element isolation film 22 and hence the unetched part 24 is likely to be exposed through the element isolation film 22. Consequently, short circuit between a resistance element 10 and the substrate 28 is more likely to be generated.

According to the present embodiment, the dummy diffusion layers 20 are formed in the substrate 28. Further, each of the dummy resistance elements 12 formed in the resistance element forming region 40 overlaps at least two dummy diffusion layers 20 aligning in the second direction perpendicular to the first direction over the substrate 28 in a planar view. By so doing, the region where the element isolation film 22 is formed in the resistance element forming region 40 reduces. As a result, it is possible to inhibit production conditions in the production of the element isolation film 22 from varying. Consequently, it is possible to inhibit a dishing phenomenon from occurring in the element isolation film 22.

Meanwhile, the present inventors have found that the occurrence of an unetched part remaining in a grove 27 of a semiconductor substrate reduces when parts where the semiconductor substrate remains as dummy diffusion layers are arrayed uniformly in the event of etching the semiconductor substrate. According to the present embodiment, at least two dummy diffusion layers 20 aligning in a second direction exist in a region overlapping a dummy resistance element 12. As a result, the dummy diffusion layers 20 can be arrayed uniformly in a resistance element forming region 40 in comparison with the case of forming one dummy diffusion layer 20 under a dummy resistance element 12 for example. Consequently, it is possible to reduce the occurrence of an unetched part 24 remaining in a grove 27 of a semiconductor substrate 28. In this way, it is possible to secure the reliability of a semiconductor device.

Further, according to the present embodiment, the dummy diffusion layers 20 are not formed in the regions overlapping the resistance elements 10 in a planar view. As a result, it is possible to inhibit the processing accuracy of the resistance elements 10 from deteriorating by the influence of the unevenness undesirably generated at the boundaries between the dummy diffusion layers 20 and the element isolation film 22. Consequently, it is possible to keep the resistance ratio accuracy of the resistance elements 10 well.

Figure 6:
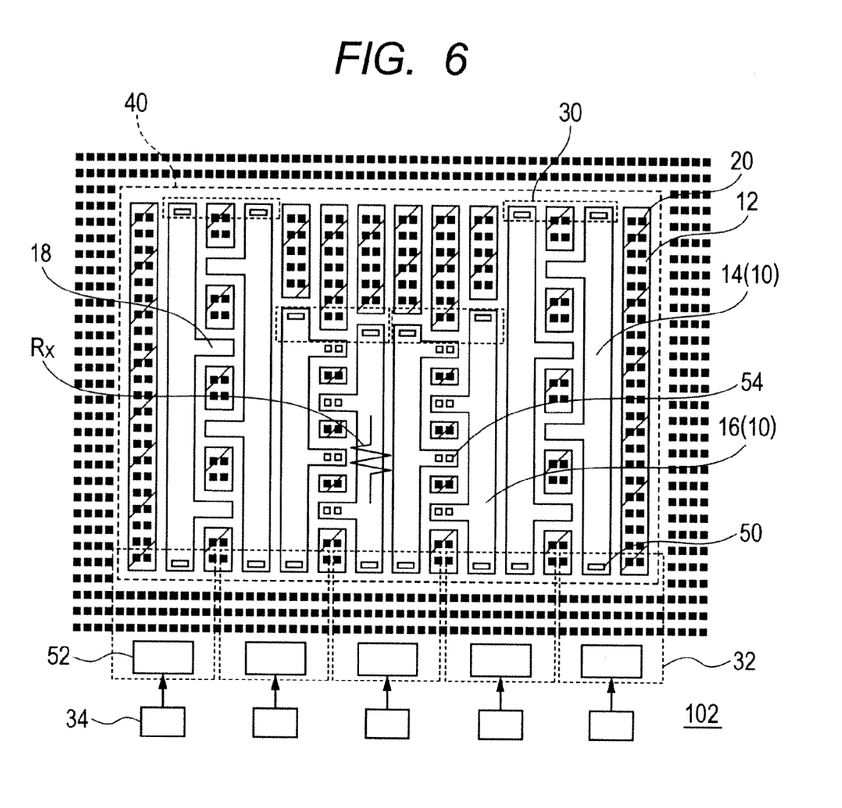
FIG. 6 is a plan view showing a semiconductor device according to a second embodiment.

FIG. 6 is a plan view showing a semiconductor device 102 according to the second embodiment and corresponds to FIG. 1 according to the first embodiment. The semiconductor substrate 102 according to the present embodiment is the same as the semiconductor substrate 100 according to the first embodiment except that drawer parts 18 are formed in the present embodiment.

The drawer parts 18 comprise protrusions protruding from resistance elements 10 toward the second direction. Contacts 54 are formed in some of the drawer parts 18 and couple the resistance elements 10 to internal circuits. Consequently, it is possible to reduce wires 30 being formed between the resistance elements 10 and coupling the resistance elements 10 to internal circuits and decrease the influence of the resistance component of the wires 30.

Further, the drawer parts 18 are formed at positions deviating from the major route of electric current flowing to the resistance elements 10. Consequently, when the contacts 54 are formed in the drawer parts 18, the parts used as the major route of electric current are not influenced by etching and the like. As a result, it is possible to inhibit the resistance ratio accuracy of the resistance elements 10 from degrading.

Further, as shown in FIG. 6, the contacts 54 are formed in the drawer parts 18 formed at resistance elements 16 constituting gamma resistance groups of low resistance. Consequently, the drawer parts 18 function as gamma electrode drawing parts. On the other hand, contacts 54 are not formed in the drawer parts 18 formed in resistance elements 14 constituting gamma resistances of high resistance. The drawer parts 18 are formed at a certain distance from the resistance elements 10. The purpose is to inhibit the resistance ratio accuracy of the resistance elements 10 from degrading due to difference in shape among the resistance elements 10. It sometimes happens however that the resistance elements 14 constituting gamma resistances of high resistance may be required to have a certain length so as to be longer than the distance between the drawer parts 18. Consequently, the resistance elements 14 do not have contacts 54 but have the drawer parts 18 not functioning as the gamma electrode drawing parts. In the present embodiment, the drawer parts 18 not having contacts 54 are formed in the resistance elements 14. By so doing, difference in shape between the resistance elements 14 and the resistance elements 16 is inhibited from being generated. Consequently, it is possible to make the resistance ratio accuracy of the resistance element 10 well.

The drawer parts 18 are formed plurally in the resistance element forming region 40. Dummy resistance elements 12 and dummy diffusion layers 20 are formed between a drawer part 18 and another drawer part 18. By so doing, it is possible to inhibit the production conditions of the resistance elements 10 from varying. Further, it is possible to increase the ratio of the area of the dummy diffusion layers 20 to the area of the resistance element forming region 40. Consequently, it is possible to inhibit a dishing phenomenon in the resistance element forming region 40 from occurring.

In the present embodiment too, it is possible to obtain the effects similar to the first embodiment.

Figure 7:
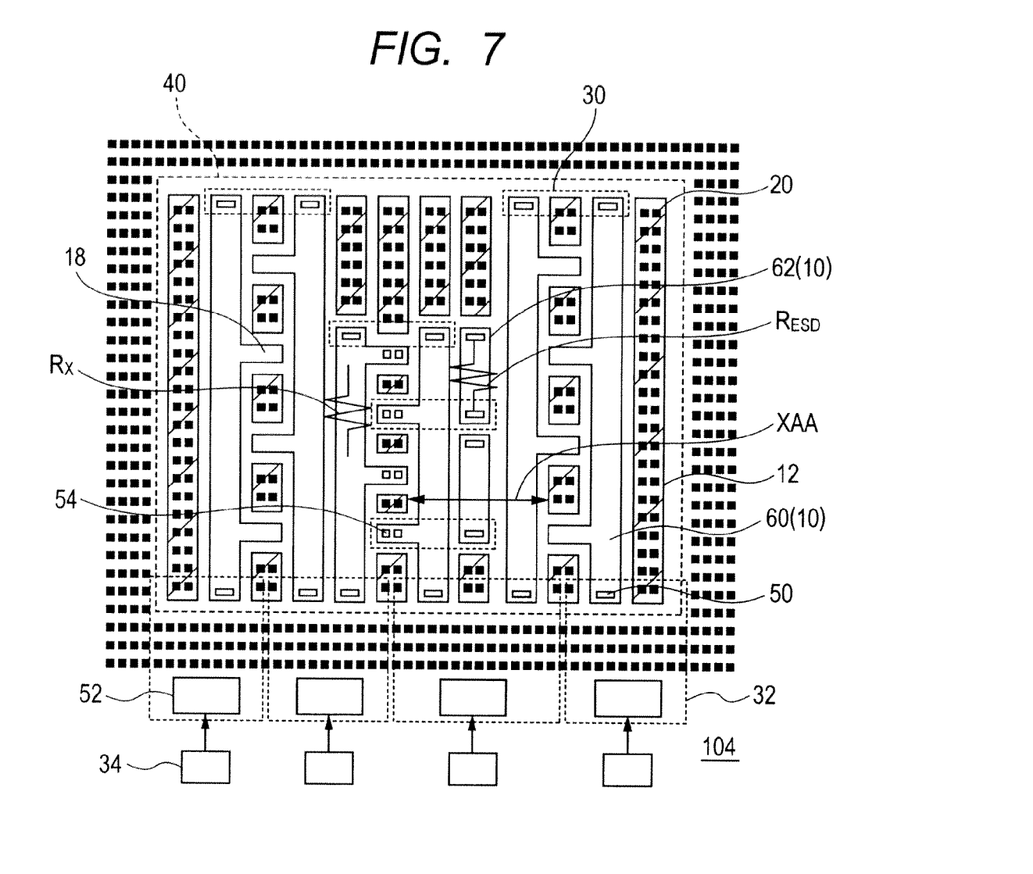
FIG. 7 is a plan view showing a semiconductor device according to a third embodiment.
Figure 8:
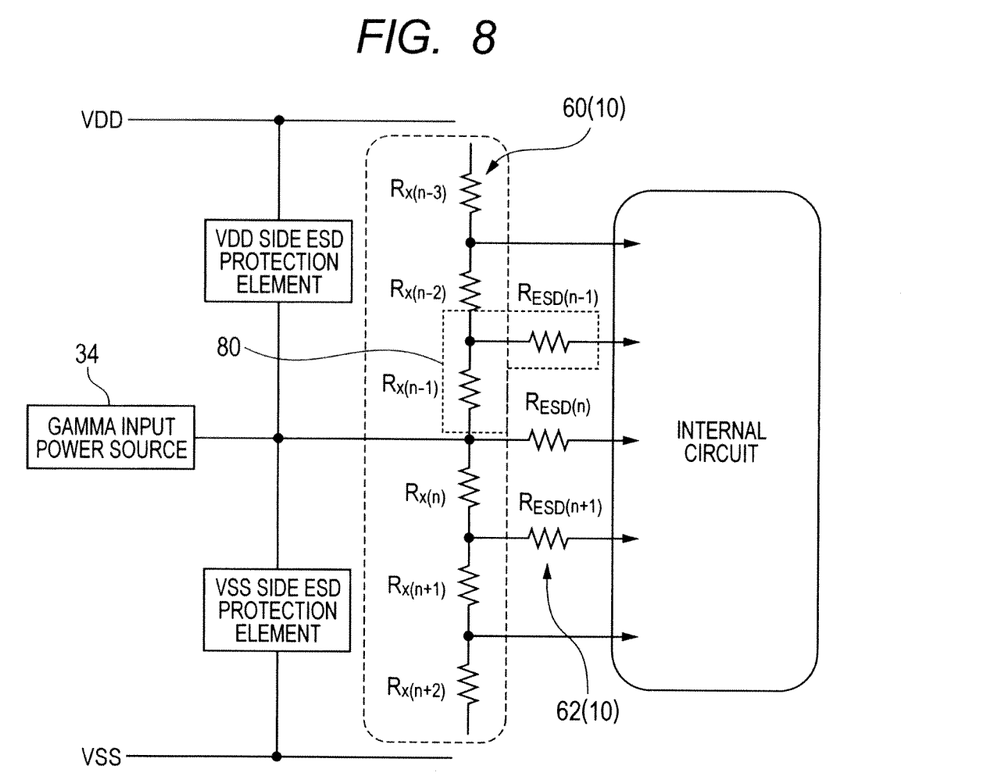
FIG. 8 is a circuit diagram showing the semiconductor device shown in FIG. 7.

FIG. 7 is a plan view showing a semiconductor device 104 according to the third embodiment and corresponds to FIG. 1 according to the first embodiment. FIG. 8 is a circuit diagram showing the semiconductor device 104 shown in FIG. 7. The semiconductor device 104 according to the present embodiment is the same as the semiconductor device 102 according to the second embodiment except that EDS protection elements are formed in the present embodiment.

In a source driver IC, a gamma input power source Vx is an external output terminal. Consequently, an EDS protection element is formed in a circuit constituting a source driver IC. An EDS protection element is formed in order to protect a circuit against ESD (Electrical Static Discharge) from outside. In the present embodiment, as shown in FIG. 8 for example, a VDD side ESD protection element is formed between a gamma input power source 34 and a VDD electrode and a VSS side ESD protection element is formed between a gamma input power source 34 and a VSS electrode.

Further, in the present embodiment, a resistance element 62 functioning as an ESD protection resistance $R_{ESD}$ is formed between a gamma input power source 34 and an internal circuit. When an ESD protection resistance $R_{ESD}$ is formed between a gamma input power source $V_X$ and a gamma resistance $R_X$, the voltage between the gamma input power source $V_X$ and the gamma resistance Rx drops and an error appears in a resistance division ratio. To cope with that, as shown in FIG. 8, a resistance element 62 functioning as an ESD protection resistance $R_{ESD}$ is formed between a resistance element 60 functioning as a gamma resistance Rx and an internal circuit. Here, a gamma resistance Rx can contribute as an ESD protection element. That is, as shown in FIG. 8, a resistance element 60 and a resistance element 62 located between a gamma input power source 34 and an internal circuit function as an ESD protection resistance 80. Consequently, when the resistance value of a resistance element 60 being located between a gamma input power source 34 and an internal circuit and functioning as a gamma resistance Rx is not less than a value necessary as an ESD protection resistance, a resistance element 62 is not formed between the gamma input power source 34 and the internal circuit.

As shown in FIG. 7, the resistance elements 10 formed in the resistance element forming region 40 constitute the resistance elements 60 as the gamma resistances $R_X$ and the resistance elements 62 as the ESD protection resistances $R_{ESD}$. The positioning of the resistance elements 62 does not influence the resistance ratio of the resistance elements 60. As a result, it is possible to array the resistance elements 62 at arbitrary positions in the resistance element forming region 40. By so doing, it is possible to array the dummy resistance elements 12 in vacant spaces between the resistance elements 62 and the resistance elements 60 with a certain degree of freedom in the resistance element forming region 40. Consequently, it is possible to equalize the area ratio of the dummy diffusion layers 20 in plural regions partitioned into small areas of several square μm in the resistance element forming region 40. It is possible to inhibit a dishing phenomenon accordingly.

Figure 9:
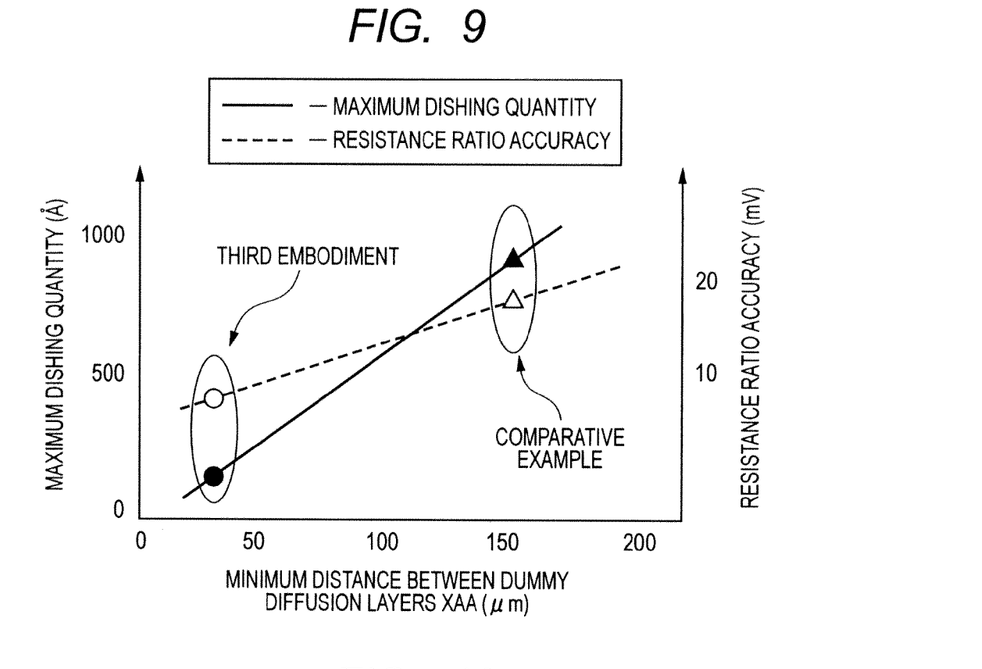
FIG. 9 is a graph showing the relationship of a maximum dishing quantity and resistance ratio accuracy to a minimum distance between dummy diffusion layers.

FIG. 9 is a graph showing the relationship of a maximum dishing quantity and resistance ratio accuracy to a minimum distance between dummy diffusion layers. Here, a minimum distance between dummy diffusion layers in FIG. 9 is defined as a maximum length among the lengths in the shortest directions (X direction or Y direction) of plural rectangles formed by dividing a region where dummy diffusion layers are not formed into the rectangles over a wafer surface. In FIG. 9, the maximum dishing quantities and the resistance ratio accuracy in the semiconductor device 104 according to the present embodiment and a semiconductor device according to a comparative example are shown, respectively. Further, the resistance ratio accuracy in FIG. 9 shows resistance ratio accuracy (mV) in the state of applying a voltage of 18 V to both the ends of the total gamma resistance comprising the resistance elements 10 formed in the resistance element forming region 40.

The semiconductor device according to a comparative example (not shown in the figure) has the same configuration as the semiconductor device 104 according to the present embodiment except that dummy diffusion layers 20 are not formed in the resistance element forming region 40. In the comparative example, a minimum distance XAA between dummy diffusion layers 20 is defined by the dummy diffusion layers 20 located outside the resistance element forming region 40. On this occasion, XAA is about 170 μm. Consequently, the region where the element isolation film 22 is formed expands and the maximum dishing quantity has a large value of about 1,000 Å. The resistance ratio accuracy has a large value of about 20 mV accordingly.

On the other hand, in the semiconductor device 104 according to the present embodiment, dummy diffusion layers 20 are formed in the resistance element forming region 40. In the semiconductor device 104 according to the present embodiment, the minimum distance of the dummy diffusion layers 20 is about 30 μm. In this way, the minimum distance of the dummy diffusion layers 20 in the present embodiment takes a value of about ⅙ of the comparative example. Then the area ratio of the dummy diffusion layers 20 to the resistance element forming region 40 improves up to about 30%. Consequently, the region where the element isolation film 22 is formed reduces and the maximum dishing quantity reduces to about 100 Å. Furthermore, the resistance ratio accuracy also takes a good value of about 10 mV.

Figure 10:
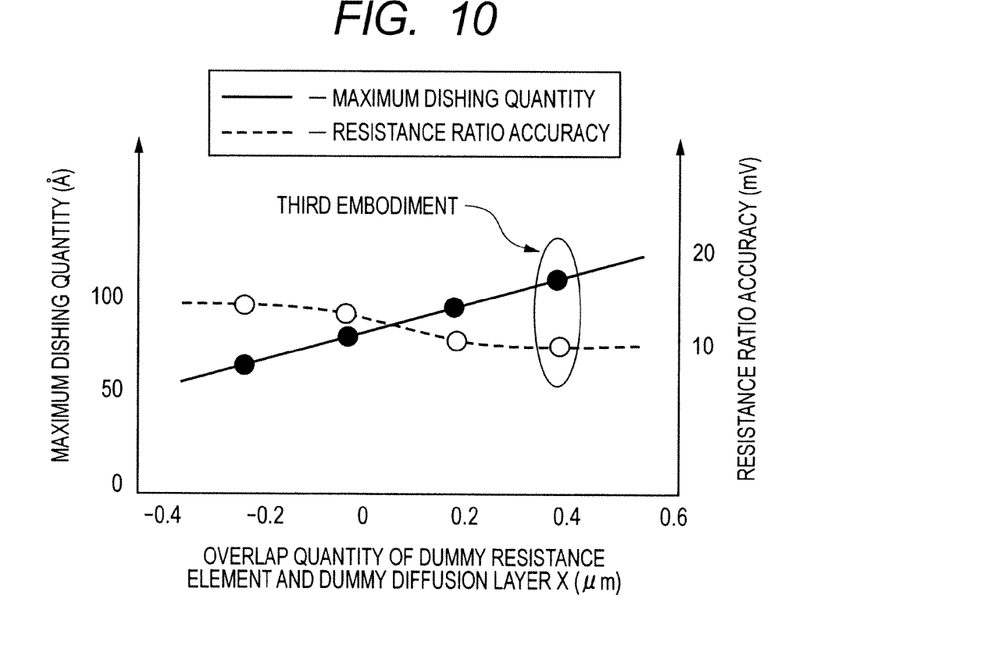
FIG. 10 is a graph showing the relationship of a maximum dishing quantity and resistance ratio accuracy to an overlap quantity of a dummy resistance element and a dummy diffusion layer.
Figure 11:
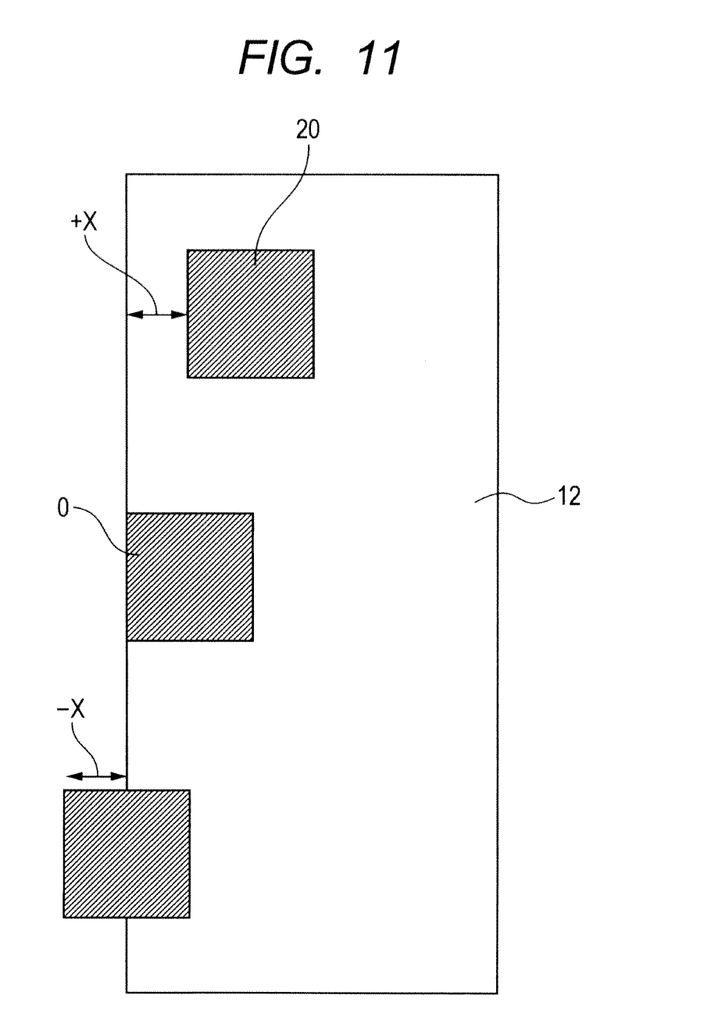
FIG. 11 is a view explaining the quantity of overlap between a dummy resistance element and a dummy diffusion layer shown in FIG. 10.

FIG. 10 is a graph showing the relationship of a maximum dishing quantity and resistance ratio accuracy to an overlap quantity of a dummy resistance element and a dummy diffusion layer. FIG. 11 is a view explaining the quantity of overlap between a dummy resistance element and a dummy diffusion layer shown in FIG. 10. The quantity X of overlap between a dummy resistance element and a dummy diffusion layer in FIG. 10 is regarded as zero when a dummy diffusion layer 20 is located inside a dummy resistance element 12 in a planar view and an edge of the dummy diffusion layer 20 overlaps an edge of the dummy resistance element 12 as shown in FIG. 11. Then, as the dummy diffusion layer 20 shifts from an edge of the dummy resistance element 12 toward the outside of the dummy resistance element 12, the overlap quantity X decreases. In contrast, as the dummy diffusion layer 20 shifts from an edge of the dummy resistance element 12 toward the inside of the dummy resistance element 12, the overlap quantity X increases.

If the quantity X of overlap between a dummy resistance element and a dummy diffusion layer decreases, the minimum distance XAA between dummy diffusion layers stated earlier decreases. Consequently, the area ratio of the dummy diffusion layers 20 to the resistance element forming region 40 increases and the maximum dishing quantity decreases. On the other hand, since an edge of a dummy resistance element 12 overlaps a dummy diffusion layer 20, the processing accuracy of the dummy resistance element 12 deteriorates. The deterioration in processing accuracy of the dummy resistance element 12 also influences the processing accuracy of a resistance element 10 adjacent to the dummy resistance element 12. As a result, the thickness of a resistance element 10 varies, the processing accuracy during etching in the production of a resistance element 10 deteriorates, and the resistance ratio accuracy of a resistance element 10 deteriorates. In contrast, if the quantity X of overlap between a dummy resistance element and a dummy diffusion layer increases, the minimum distance XAA between dummy diffusion layers stated above increases. Consequently, whereas the maximum dishing quantity increases, the resistance ratio accuracy of a resistance element 10 improves.

In the semiconductor device 104 according to the present embodiment, the overlap quantity X of a dummy resistance element and a dummy diffusion layer is 0.4 μm. As shown in FIG. 10, when the overlap quantity X of a dummy resistance element and a dummy diffusion layer is 0.3 μm or more, the resistance ratio accuracy is stable. On the other hand, in the production of a resistance element 10, a variation in processing accuracy of about 0.1 μm is caused during etching. Consequently, by setting the overlap quantity X of a dummy resistance element and a dummy diffusion layer at 0.4 μm, it is possible to inhibit the maximum dishing quantity while a stable resistance ratio accuracy of about 10 mV is realized. Further, in an LCD source driver IC, when the resistance ratio accuracy is about 15 mV or less, image variation comes to be a level of not visually observable. Consequently, in the present embodiment, it is possible to control the resistance ratio accuracy to about 10 mV and realize a highly fine LCD source driver IC. Here, the overlap quantity X of a dummy resistance element and a dummy diffusion layer can be designed appropriately so as to have an optimum value in consideration of the inhibition of the occurrence of a dishing phenomenon, the improvement of resistance ratio accuracy, the inhibition of the remain of an unetched part during the etching of a substrate, and others.

In the present embodiment too, it is possible to obtain the effects similar to the first embodiment.

Figure 12:
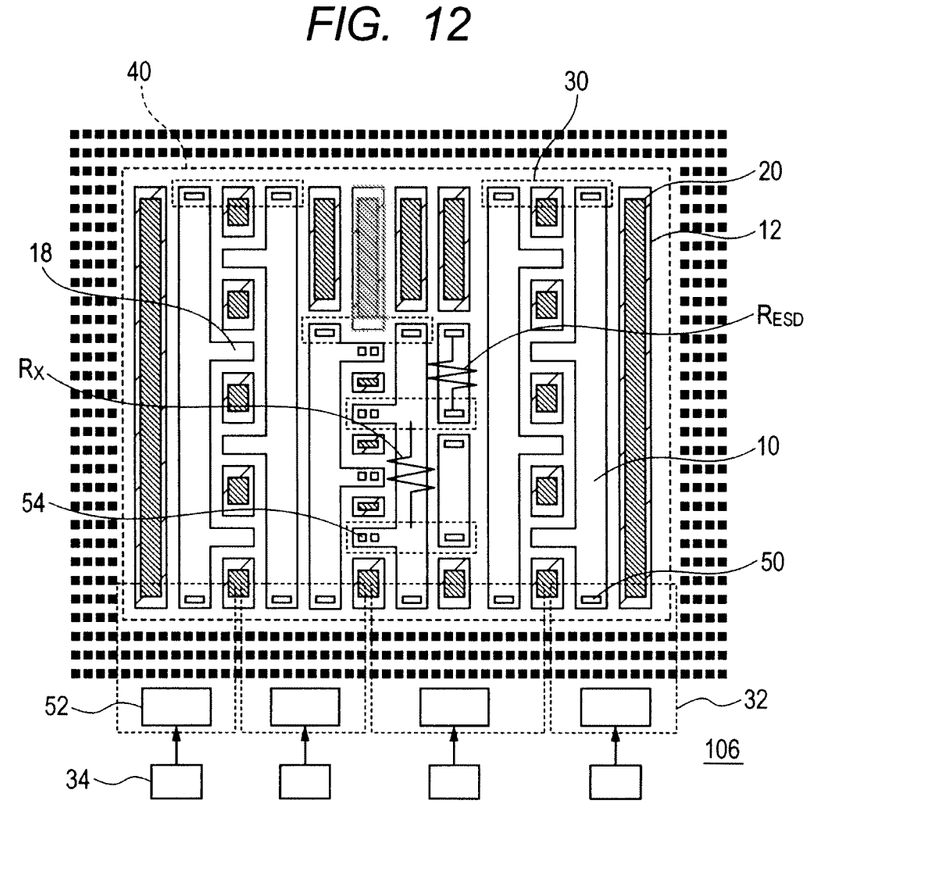
FIG. 12 is a plan view showing a semiconductor device according to a modification of the semiconductor device shown in FIG. 7.

FIG. 12 is a plan view showing a semiconductor device 106 according to a modification of the semiconductor device 104 shown in FIG. 7. The semiconductor device 106 has the same configuration as the semiconductor device 104 except that the dummy diffusion layers 20 formed in regions overlapping the dummy resistance elements 12 are not isolated from each other in both the first and second directions. The semiconductor device 104 according to the third embodiment may have a configuration similar to the semiconductor device 106.

Figure 13:
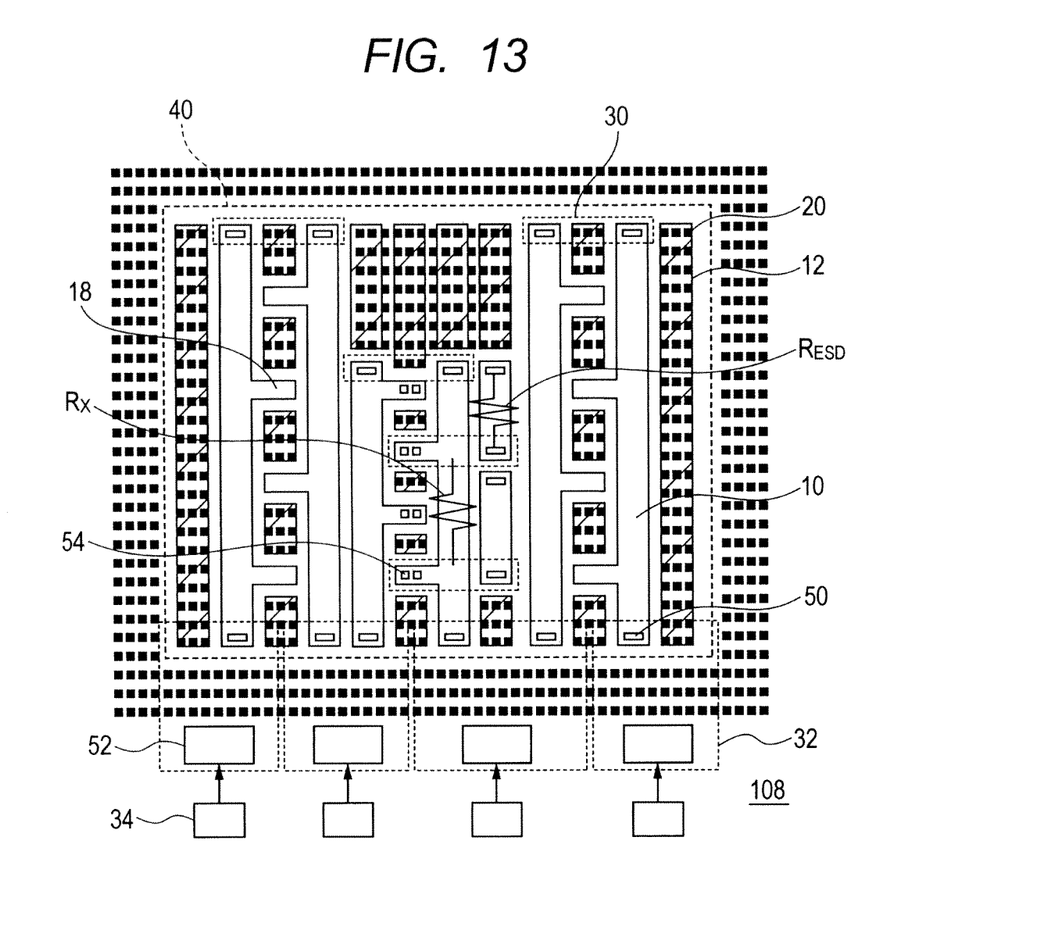
FIG. 13 is a plan view showing a semiconductor device according to a fourth embodiment.

FIG. 13 is a plan view showing a semiconductor device 108 according to the fourth embodiment and corresponds to FIG. 7 according to the third embodiment. The semiconductor device 108 according to the present embodiment has the same configuration as the semiconductor device 104 according to the third embodiment except the configuration of the dummy diffusion layers 20.

In the present embodiment, some of the dummy diffusion layers 20 are located between adjacent two dummy resistance elements 12 in a planar view. Plural dummy diffusion layers 20 are arrayed so that the distance between two dummy diffusion layers 20 adjacent to each other in the second direction may be constant in regions overlapping the dummy resistance elements 12 and regions located in between in a planar view.

Further, in the present embodiment, some of the dummy diffusion layers 20 may be located between a resistance element 10 and a dummy resistance element 12 adjacent to each other in a planar view. On this occasion, the distance between a dummy diffusion layer 20 and a resistance element 10 in a planar view is preferably 1 μm or more for example. By keeping the distance between a dummy diffusion layer 20 and a resistance element 10 at 1 μm or more in a planar view, it is possible to inhibit the processing accuracy of the resistance element 10 from degrading by the influence of the dummy diffusion layers 20. Consequently, it is possible to keep the resistance ratio accuracy of the resistance elements 10 well.

In the present embodiment too, it is possible to obtain the effects similar to the third embodiment. Further, some of the dummy diffusion layers 20 are located between adjacent two dummy resistance elements 12 in a planar view. As a result, it is possible to improve the area ratio of the dummy diffusion layers 20 to the resistance element forming region 40. Consequently, it is possible to inhibit a dishing phenomenon from occurring. With the semiconductor device 108 according to the present embodiment, the area ratio of the dummy diffusion layers 20 to the resistance element forming region 40 improves by about 5% to 15% in comparison with the third embodiment.

Although the embodiments according to the present invention have been described above in reference to drawings, those embodiments are examples of the present invention and various configurations other than above configurations can be adopted.

What is claimed is:

1. A semiconductor device comprising a substrate, an insulation film being embedded into the substrate and having a plurality of openings, a plurality of dummy diffusion layers formed in the substrate and located in the openings, a plurality of resistance elements being formed over the insulation film so as not to overlap the dummy diffusion layers in a planar view in a resistance element forming region and extending in a first direction, and a plurality of dummy resistance elements being formed over the insulation film and the dummy diffusion layers and extending in the first direction in the resistance element forming region, wherein each of the dummy resistance elements overlaps at least two dummy diffusion layers aligning in a second direction perpendicular to the first direction in a plane horizontal to the substrate in a planar view.

2. The semiconductor device according to claim 1, wherein each of the dummy resistance elements overlaps at least the two dummy diffusion layers aligning in the first direction in a planar view.

3. The semiconductor device according to claim 1, wherein the dummy diffusion layers are formed in regions overlapping the dummy resistance elements and regions located in between in a planar view.

4. The semiconductor device according to claim 3, wherein the dummy diffusion layers are arrayed so that the distance between two the dummy diffusion layers adjacent to each other in the second direction may be constant in regions overlapping the dummy resistance elements and regions located in between in a planar view.

5. The semiconductor device according to claim 1, wherein the dummy diffusion layers are formed in regions overlapping the dummy resistance elements and are not formed in another region in the resistance element forming region in a planar view.

6. The semiconductor device according to claim 5, wherein the dummy diffusion layers are arrayed so that the distance between two the dummy diffusion layers adjacent to each other in the second direction may be constant in regions overlapping the dummy resistance elements in a planar view.

7. The semiconductor device according to claim 4, wherein: the dummy diffusion layers are formed outside the resistance element forming region; and the dummy diffusion layers formed outside the resistance element forming region are arrayed so that the distance between two the dummy diffusion layers adjacent to each other in the second direction may be equal to a distance between two the dummy diffusion layers adjacent to each other formed in regions overlapping the dummy resistance elements in a planar view.

8. The semiconductor device according to claim 1, wherein, over the surface of the substrate, the area occupied by the dummy diffusion layers formed in the resistance element forming region accounts for 20% or more of the area of the resistance element forming region.

9. The semiconductor device according to claim 1, wherein the semiconductor device has a protrusion protruding from one of the resistance elements toward the second direction.

10. The semiconductor device according to claim 9,
wherein the semiconductor device has a plurality of protrusions, and
wherein the dummy resistance elements and the dummy diffusion layers are formed between one of the protrusions and another of the protrusions.

* * * * *